United States Patent
Khan et al.

(10) Patent No.: US 11,301,167 B2
(45) Date of Patent: *Apr. 12, 2022

(54) TECHNOLOGIES FOR PROVIDING MULTIPLE TIER MEMORY MEDIA MANAGEMENT

(71) Applicant: Intel Corporation, Santa Clara, CA (US)

(72) Inventors: Jawad B. Khan, Portland, OR (US); Shigeki Tomishima, Portland, OR (US); Srikanth Srinivasan, Portland, OR (US); Chetan Chauhan, Folsom, CA (US); Rajesh Sundaram, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/414,265

(22) Filed: May 16, 2019

(65) Prior Publication Data
US 2019/0272121 A1  Sep. 5, 2019

(51) Int. Cl.
| | |
|---|---|
| *G06F 3/06* | (2006.01) |
| *H03M 13/29* | (2006.01) |
| *H03M 13/00* | (2006.01) |
| *G06F 3/00* | (2006.01) |
| *G11C 7/10* | (2006.01) |
| *G06F 11/10* | (2006.01) |
| *G06N 3/08* | (2006.01) |

(52) U.S. Cl.
CPC .......... *G06F 3/0659* (2013.01); *G06F 3/0604* (2013.01); *G06F 3/0653* (2013.01); *G06F 3/0673* (2013.01); *G06F 11/1076* (2013.01); *G06N 3/08* (2013.01); *G11C 7/1051* (2013.01); *G11C 7/1096* (2013.01); *H03M 13/2906* (2013.01)

(58) Field of Classification Search
CPC .... G06F 3/0659; G06F 3/0604; G06F 3/0653; G06F 3/0673; G06F 11/1076; G06N 3/08; G11C 7/1051; G11C 7/1096; H03M 13/2906

See application file for complete search history.

(56) References Cited

U.S. PATENT DOCUMENTS 9,779,786 B1 * 10/2017 Wu .................. G06K 9/6273
10,242,423 B2 * 3/2019 Ould-Ahmed-Vall ...................... G06F 9/30185

(Continued)

OTHER PUBLICATIONS

Extended European Search Report for Patent Application No. 20166243.4, dated Oct. 12, 2020, 11 pages.

*Primary Examiner* — Justin R Knapp
(74) *Attorney, Agent, or Firm* — Compass IP Law PC

(57) ABSTRACT

Technologies for providing multiple tier memory media management include a memory having a media access circuitry connected to a memory media. The media access circuitry is to receive a request to perform an in-memory compute operation. Additionally, the media access circuitry is to read, in response to the request, data from a memory media region of the memory media, write the read data into a compute media region of the memory, perform, on the data in the compute media region, the in-memory compute operation, write, to the memory media region, resultant data indicative of a result of performance of the in-memory compute operation.

19 Claims, 7 Drawing Sheets

(56) References Cited

U.S. PATENT DOCUMENTS

| | | | |
|---|---|---|---|
| 10,534,747 B2* | 1/2020 | Tomishima | G06F 3/06 |
| 2015/0199266 A1 | 7/2015 | Franchetti et al. | |
| 2016/0179615 A1 | 6/2016 | Lee | |
| 2017/0161143 A1* | 6/2017 | Reed | G11C 11/4093 |
| 2018/0196614 A1* | 7/2018 | Ivanov | G06F 11/1008 |
| 2019/0042199 A1 | 2/2019 | Sumbul et al. | |
| 2019/0227750 A1* | 7/2019 | Srinivasan | G06F 3/0679 |
| 2019/0227871 A1* | 7/2019 | Wu | G06F 3/0659 |
| 2019/0228809 A1* | 7/2019 | Srinivasan | G06F 3/0679 |
| 2019/0266219 A1* | 8/2019 | Chauhan | G06F 9/30101 |

* cited by examiner

TECHNOLOGIES FOR PROVIDING MULTIPLE TIER MEMORY MEDIA MANAGEMENT

BACKGROUND

Management of a memory media (e.g., the device or material that data is written to and read from) is typically performed by a memory controller of a computer. The memory controller may receive commands from a host (e.g., a processor of a compute device executing an application) to write to and/or read from the memory media, coordinate the performance of the received commands (e.g., performing memory accesses in response to the commands), and track a history of the memory accesses performed over time. By tracking the amount of time that has elapsed since a memory cell (e.g., a unit of the memory media capable of retaining a data value) was written to, the memory controller may adjust a reference voltage usable to determine whether a voltage at that memory cell is representative of a one or a zero (or other value) due to a drift (e.g., a gradual change) in the voltage over time. Similarly, the tracked memory accesses may be usable in performing wear leveling (e.g., distributing memory access operations across the available memory cells of the memory media) to reduce the likelihood that a subset of the available memory cells of the memory media will be used more, and thereby fail sooner, than other memory cells of the memory media. However, if the memory controller is unaware of memory access operations being performed in the memory, the memory controller is unable to effectively manage the memory media and may inadvertently interrupt an ongoing operation that is being performed in the memory.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Figure 1:
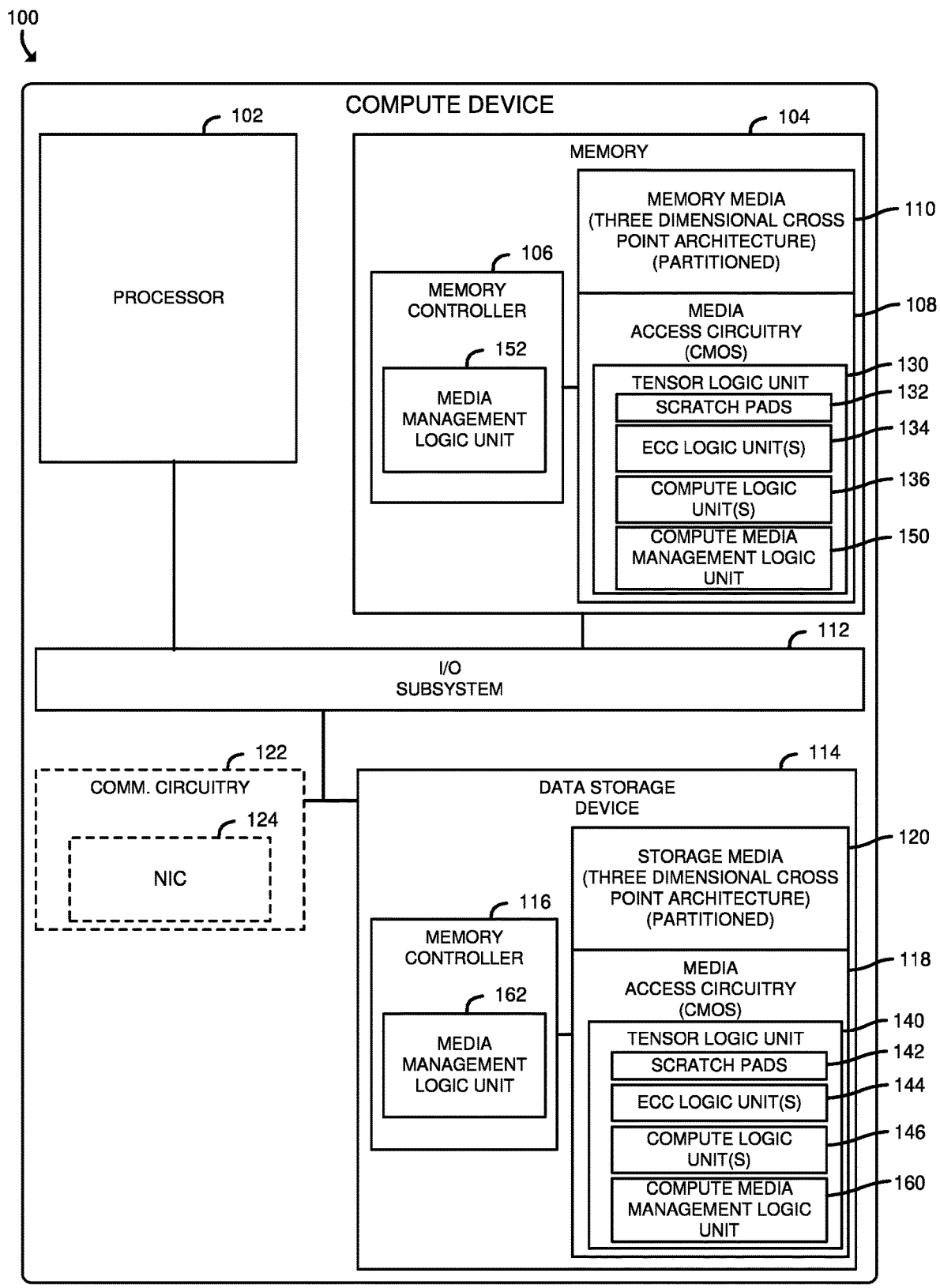
FIG. 1 is a simplified diagram of at least one embodiment of a compute device for providing multiple tier memory media management.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Referring now to FIG. 1, a compute device 100 for providing multiple tiers of memory media management (e.g., management of a storage/memory media region of a memory media and management of a compute media region of the memory media) includes a processor 102, memory 104, an input/output (I/O) subsystem 112, a data storage device 114, and communication circuitry 122. Of course, in other embodiments, the compute device 100 may include other or additional components, such as those commonly found in a computer (e.g., a display, peripheral devices, etc.). Additionally, in some embodiments, one or more of the illustrative components may be incorporated in, or otherwise form a portion of, another component. As explained in more detail herein, the media access circuitry 108, in the illustrative embodiment, is local to (e.g., on the same die, in the same package, etc.) the memory media 110 and may perform compute operations on data from the memory media 110, thereby eliminating the need for data to be sent (e.g., through a bus) to the processor 102 or another component of the compute device 100 for computations to be performed on the data. In the illustrative embodiment, the media access circuitry 108 reads data to be operated on from a storage/memory media region of the memory media 110 that is managed by the memory controller 106 (e.g., by a compute media management logic unit 150, which may be embodied as any device or circuitry, such as reconfigurable circuitry, an application specific integrated circuit (ASIC), etc. configured to perform management of the storage/memory media region) and writes the data to another region of the memory media 110, referred to herein as the compute media region, which is managed exclusively by the media access circuitry 108 (e.g., by a media management logic unit 152, which may be embodied as any device or circuitry, such as reconfigurable circuitry, an application specific integrated circuit (ASIC), etc. configured to perform management of the compute media region). As such, the memory controller 106 is unaware of and has no direct control over read/write operations that are performed on data in the compute media region of the memory media 110). In performing a compute operation on the data, the media access circuitry 108 may perform multiple reads and writes to and from the compute media region, and may independently manage the memory access operations, tracking of wear on the memory cells in the compute media region, performing wear leveling, and adjusting reference voltages usable to determine the values of data residing in the compute media region. By offloading such operations from the more generalized memory controller 106 to the media access circuitry 108, the memory controller 106 may be less complex (e.g., utilize a smaller die size, consume less power, etc.) than it would otherwise be, while still enabling in-memory computations to occur (e.g., rather than requiring the data to be sent to and from the processor 102 to perform computations on the data, which would consume additional energy and time).

The memory media 110, in the illustrative embodiment, has a three-dimensional cross point architecture that has data access characteristics that differ from other memory architectures (e.g., dynamic random access memory (DRAM)), such as enabling access to one bit per tile and incurring time delays between reads or writes to the same partition or other partitions. The media access circuitry 108 is configured to make efficient use (e.g., in terms of power usage and speed) of the architecture of the memory media 110, such as by accessing multiple tiles in parallel within a given partition, utilizing scratch pads (e.g., relatively small, low latency memory) to temporarily retain and operate on data read from the memory media 110, and broadcasting data read from one partition to other portions of the memory 104 to enable matrix calculations (e.g., tensor operations) to be performed in parallel within the memory 104. Additionally, in the illustrative embodiment, instead of sending read or write requests to the memory 104 to access matrix data, the processor 102 may send a higher-level request (e.g., a type of matrix calculation to perform) and provide the locations and dimensions (e.g., in memory) of the matrices to be utilized in the requested operation (e.g., an input matrix, a weight matrix, and an output matrix). Further, rather than sending back the resulting data to the processor 102, the memory 104 may merely send back an acknowledgement (e.g., "Done"), indicating that the requested operation has been completed. As such, many compute operations, such as artificial intelligence operations (e.g., tensor operations involving matrix calculations) can be performed in memory 104, with minimal usage of the bus between the processor 102 and the memory 104. In some embodiments the media access circuitry 108 is included in the same die as the memory media 110. In other embodiments, the media access circuitry 108 is on a separate die but in the same package as the memory media 110. In yet other embodiments, the media access circuitry 108 is in a separate die and separate package but on the same dual in-line memory module (DIMM) or board as the memory media 110.

The processor 102 may be embodied as any device or circuitry (e.g., a multi-core processor(s), a microcontroller, or other processor or processing/controlling circuit) capable of performing operations described herein, such as executing an application (e.g., an artificial intelligence related application that may utilize a neural network or other machine learning structure to learn and make inferences). In some embodiments, the processor 102 may be embodied as, include, or be coupled to an FPGA, an application specific integrated circuit (ASIC), reconfigurable hardware or hardware circuitry, or other specialized hardware to facilitate performance of the functions described herein.

The memory 104, which may include a non-volatile memory (e.g., a far memory in a two-level memory scheme), includes the memory media 110 and the media access circuitry 108 (e.g., a device or circuitry, such as integrated circuitry constructed from complementary metal-oxide-semiconductors (CMOS) or other materials) underneath (e.g., at a lower location) and coupled to the memory media 110. The media access circuitry 108 is also connected to the memory controller 106, which may be embodied as any device or circuitry (e.g., a processor, a co-processor, dedicated circuitry, etc.) configured to selectively read from and/or write to the memory media 110 in response to corresponding requests (e.g., from the processor 102 which may be executing an artificial intelligence related application that relies on tensor operations to train a neural network and/or to make inferences).

Figure 2:
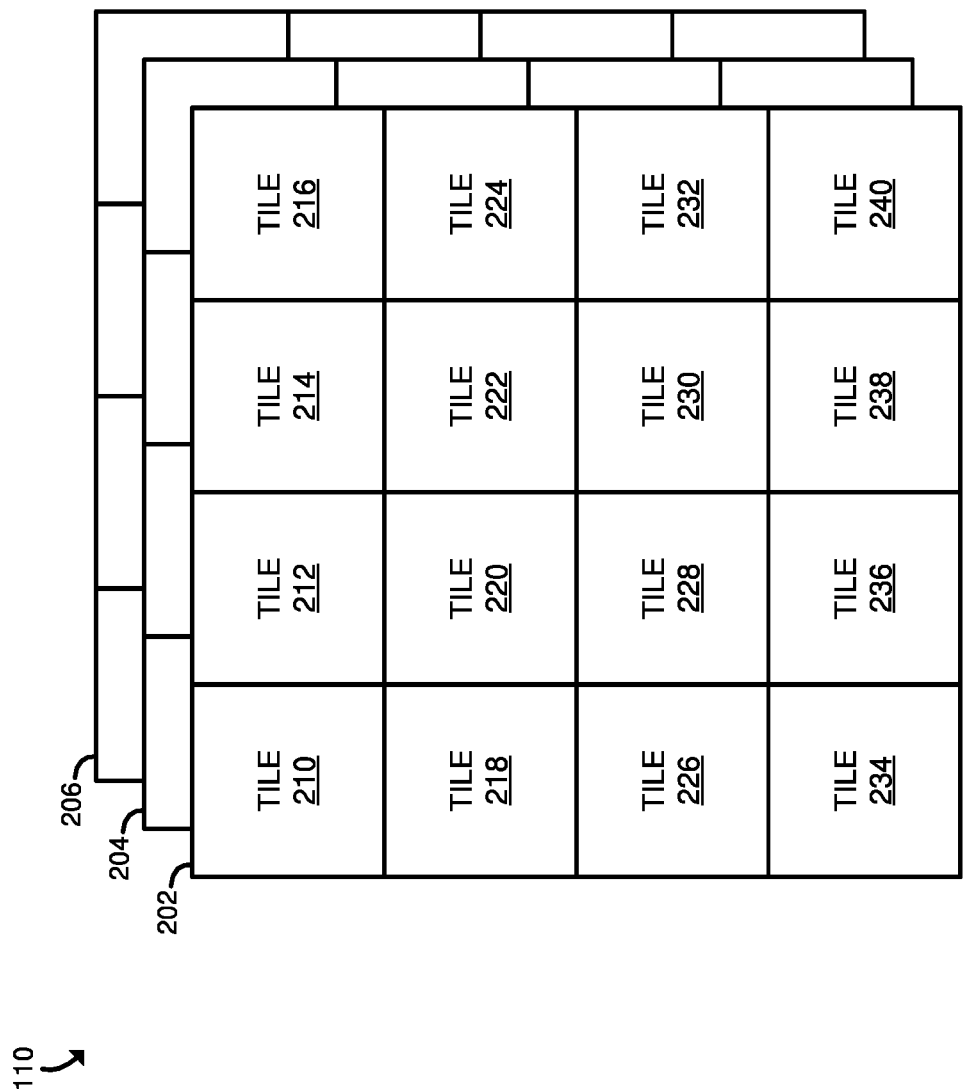
FIG. 2 is a simplified diagram of at least one embodiment of a memory media included in the compute device of FIG. 1.

Referring briefly to FIG. 2, the memory media 110, in the illustrative embodiment, includes a tile architecture, also referred to herein as a cross point architecture (e.g., an architecture in which memory cells sit at the intersection of word lines and bit lines and are individually addressable and in which bit storage is based on a change in bulk resistance), in which each memory cell (e.g., tile) 210, 212, 214, 216, 218, 220, 222, 224, 226, 228, 230, 232, 234, 236, 238, 240 is addressable by an x parameter and a y parameter (e.g., a column and a row). The memory media 110 includes multiple partitions, each of which includes the tile architecture. The partitions may be stacked as layers 202, 204, 206 to form a three-dimensional cross point architecture (e.g., Intel 3D XPoint™ memory). Unlike typical memory devices, in which only fixed-size multiple-bit data structures (e.g., byte, words, etc.) are addressable, the media access circuitry 108 is configured to read individual bits, or other units of data, from the memory media 110 at the request of the memory controller 106, which may produce the request in response to receiving a corresponding request from the processor 102.

Referring back to FIG. 1, the media access circuitry 108, in the illustrative embodiment, includes a tensor logic unit 130, which may be embodied as any device or circuitry (e.g., CMOS circuitry) configured to offload the performance of tensor operations from other portions of the media access circuitry 108. The tensor logic unit 130, in the illustrative embodiment, includes multiple memory scratch pads 132, each of which may be embodied as any device or circuitry (e.g., static random access memories (SRAMs), register files, etc.) usable to provide relatively fast (e.g., low latency) access to data (e.g., matrix data) that has been read from the memory media 110. In the illustrative embodiment, the scratch pads 132 provide faster read and write access times than the memory media 110 which has comparatively slower access times and a larger capacity. The tensor logic unit 130 may also include an error correction code (ECC) logic unit 134, which may be embodied as any device or circuitry (e.g., reconfigurable circuitry, an ASIC, etc.) configured to perform an error correction algorithm (e.g., a Reed-Solomon algorithm, a Bose-Chaudhuri-Hocquenghem (BCH) algorithm, Low Density Parity Check Coding (LDPC), etc.) on data written to and read from the memory media 110 to detect and correct any errors (e.g., due to corruption). Additionally, in the illustrative embodiment, the tensor logic unit 130 includes multiple compute logic units 136 each of which may be embodied as any device or circuitry (e.g., reconfigurable circuitry, ASICs, etc.) configured to perform compute operations on data read from the memory media 110 (e.g., after the ECC logic unit 134 has performed an error correction process on the data).

Figure 3:
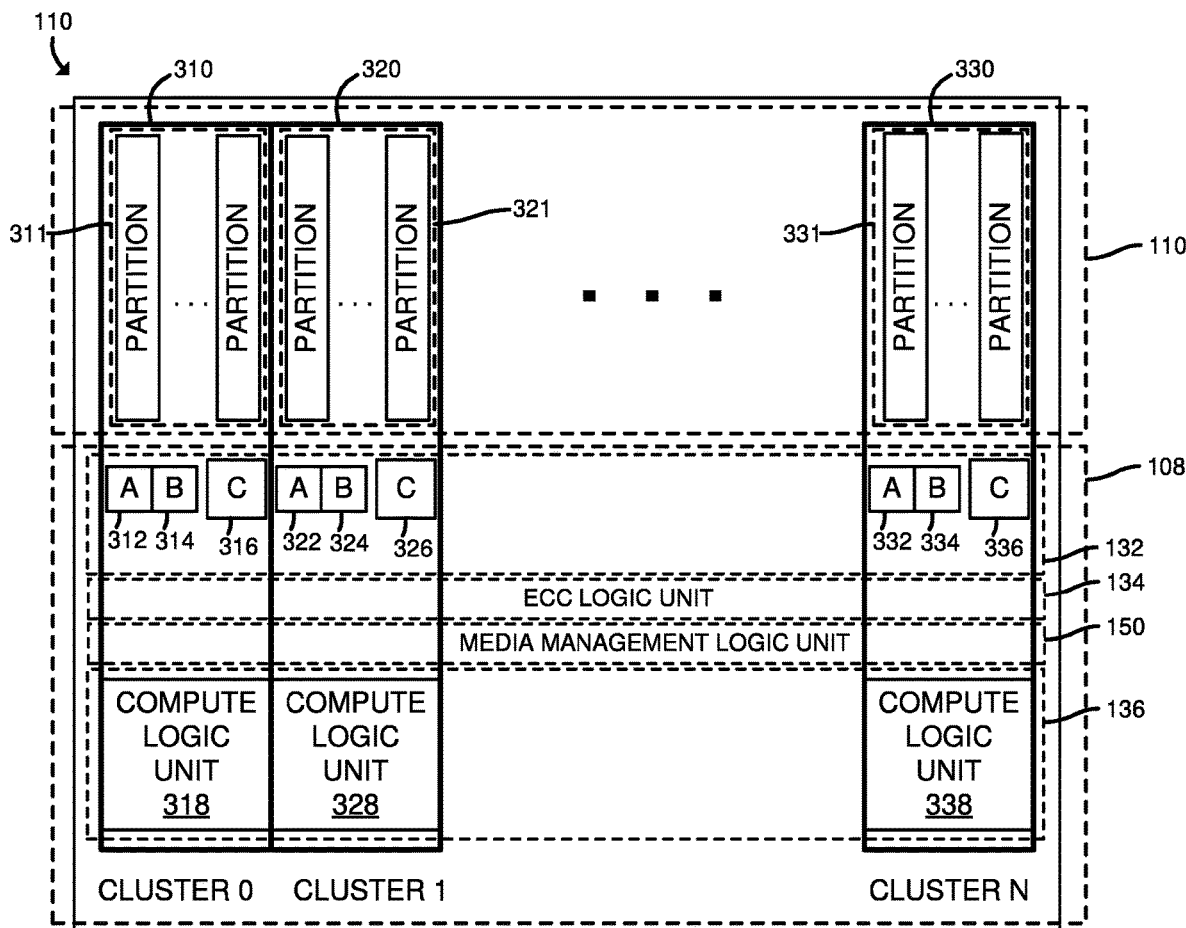
FIG. 3 is a simplified diagram of at least one embodiment of partitions of the memory media and components of a media access circuitry of a memory included in the compute device of FIG. 1.

Referring briefly to FIG. 3, in the illustrative embodiment, components of the memory 104 are divided into clusters 310, 320, 330 (e.g., groupings of components). The cluster 310 includes multiple partitions 311 of the memory media 110, a set of scratch pads 312, 314, 316, each similar to the scratch pads 132 of FIG. 1, and a corresponding compute logic unit 318, similar to the compute logic unit 136 of FIG. 1. Similarly, the cluster 320 includes another set of partitions 321 of the memory media 110, a corresponding set of scratch pads 322, 324, 326, and a corresponding compute logic unit 328. The cluster 330 also includes a set of partitions 331 of the memory media 110, a corresponding set of scratch pads 332, 334, 336, and a compute logic unit 338. In the illustrative embodiment, in operation, the compute logic unit 318 reads a subset of matrix data (e.g., one value of an input matrix A from the set of partitions (e.g., partitions 311)) and provides the read data to the ECC logic unit 134 to perform an error correction process to correct any errors in the data. The compute logic unit 318 may additionally write the data (e.g., after the error correction process has been performed) into the corresponding scratch pad 312 and may broadcast that same subset of the matrix data to the corresponding scratch pads of the other clusters (e.g., to the scratch pads 322, 332). Similarly, the compute logic unit 328 may read, from the corresponding set of partitions 321 another subset of the matrix data (e.g., another value of the input matrix A) into the corresponding scratch pad 322, utilizing the ECC logic unit 134 to correct any errors, and broadcast that subset of the matrix data to the other scratch pads that are to store data for that matrix (e.g., to the scratch pads 312, 332). The compute logic unit 338 may perform similar operations.

By broadcasting, to the other scratch pads, matrix data that has been read from a corresponding set of partitions of the memory media 110, the media access circuitry 108 reduces the number of times that a given section (e.g., set of partitions) of the memory media 110 must be accessed to obtain the same matrix data (e.g., the read matrix data may be broadcast to multiple scratch pads after being read from the memory media 110 once, rather than reading the same matrix data from the memory media 110 multiple times). Further, by utilizing multiple compute logic units 318, 328, 338 that are each associated with corresponding scratch pads 312, 314, 316, 322, 224, 226, 232, 234, 236, the media access circuitry 108 may perform the portions of a tensor operation (e.g., matrix multiply and accumulate) concurrently (e.g., in parallel). It should be understood that while three clusters 310, 320, 330 are shown in FIG. 3 for simplicity, the actual number of clusters and corresponding partitions, scratch pads, and compute logic units may differ depending on the particular embodiment.

Figure 4:
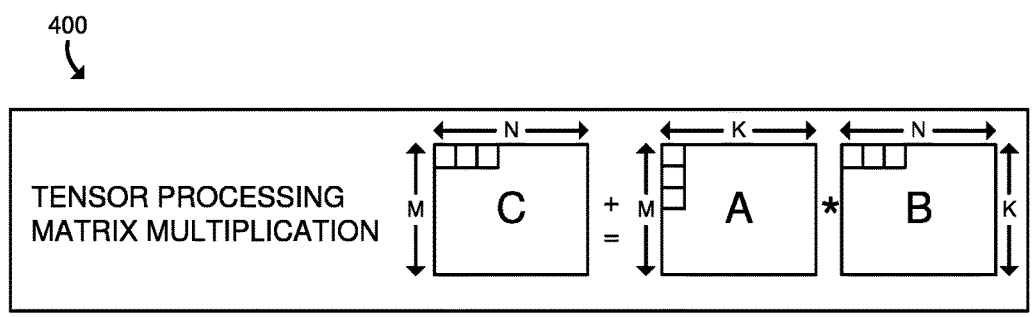
FIG. 4 is a simplified diagram of at least one embodiment of a tensor operation that may be performed in the memory of the compute device of FIG. 1.

Referring briefly to FIG. 4, an example of a matrix multiplication (e.g., matrix multiply and accumulate) operation 400 that may be performed by the memory 104 is shown. As illustrated, matrix data in an input matrix A is multiplied by matrix data in another matrix B (e.g., weight data for a layer of a convolutional neural network) and the resultant data is written to the output matrix C. Each matrix represented in FIG. 4 is temporarily stored as matrix data in the scratch pads 132 of the media access circuitry 108. In some embodiments, the output matrix C may be utilized as an input matrix for a subsequent tensor operation (e.g., as an input matrix for a subsequent layer of a convolutional neural network).

Figure 5:
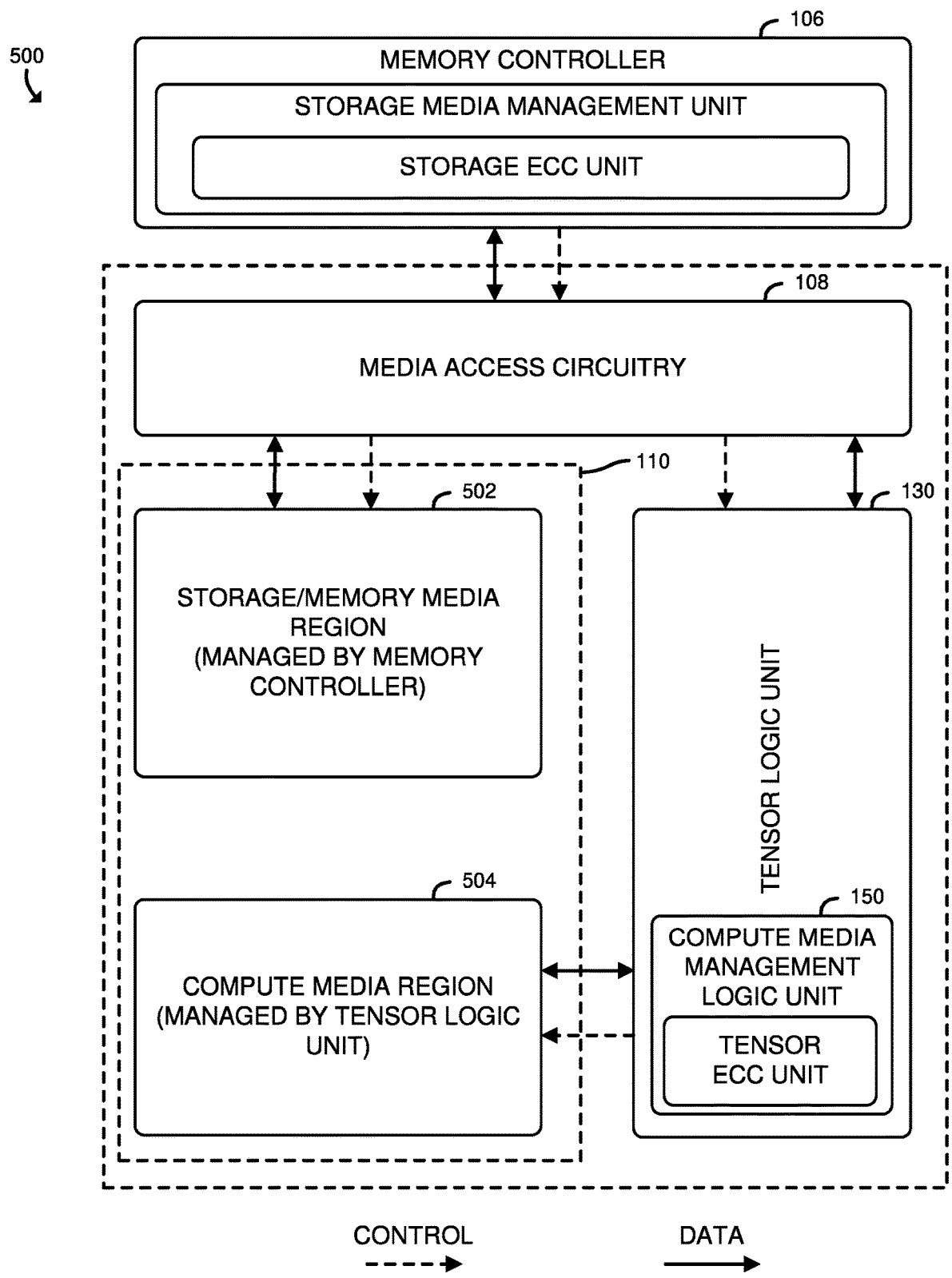
FIG. 5 is a simplified diagram of different media regions of the memory media that may be managed by the compute device of FIG. 1.

Referring now to FIG. 5, a diagram 500 of different media regions 502, 504 of the memory media 110 is shown. As indicated, tensor logic unit 130 may utilize the compute media management logic unit 150 to manage writes to and reads from a compute media region 504 (e.g., a designated subset of the memory cells) of the memory media 110 when performing in-memory compute operations, such as matrix operations (e.g., tensor operations), artificial intelligence related operations (e.g., training a neural network, determining an inference with a trained neural network, etc.), and/or other operations. The memory controller 106 does not have direct control over memory accesses to the compute media region 504. Rather, the memory controller 106 manages a different region, the storage/memory media region 502 (e.g., a designated subset of the memory cells) of the memory media 110. In operation, and as described herein, the memory controller 106 may provide a request to the media access circuitry 108 (e.g., to the tensor logic unit 130) to perform an in-memory compute operation on a set of data, and provide, with the request, location data indicative of a location of the data in the storage/memory media region 502 on which the in-memory compute operation is to be performed. In response, the tensor logic unit 130 reads the data from the location in the storage/media region 502, writes the data to the compute media region 504, and performs in-memory compute operations on the data in the compute media region 504. In doing so, the tensor logic unit 130 may read and write to and from the compute media region 504 multiple times (e.g., reading and/or writing intermediate results) until resultant data indicative of a result of the in-memory compute operation is produced. The tensor logic unit 130 may then write the resultant data back to the storage/memory media region 502. The memory controller 106 may send a read command to the storage/memory media region 502, receive the data, ECC correct the data using a storage ECC unit, write the corrected data to the tensor logic unit 130, which will ECC protect the data using a tensor ECC unit, and subsequently write the data to the compute media region 504. Conversely, the tensor logic unit 150 may read data from the compute media region 504, perform ECC correction on the read data using the tensor ECC unit, and provide the data to the memory controller 106, which may perform further ECC correction on the data using the storage ECC unit. In the illustrative embodiment, the tensor logic unit 130 (e.g., the tensor ECC unit of the tensor logic unit 130) and the memory controller 106 (e.g., the storage ECC unit of the memory controller 106) may perform different ECC algorithms and the strength of the algorithms may differ (e.g., the memory controller 106 may perform a stronger ECC algorithm (e.g., to correct more errors) than the tensor logic unit 130).

Referring back to FIG. 1, the memory 104 may include non-volatile memory and volatile memory. The non-volatile memory may be embodied as any type of data storage capable of storing data in a persistent manner (even if power is interrupted to the non-volatile memory). For example, the non-volatile memory may be embodied as one or more non-volatile memory devices. The non-volatile memory devices may include one or more memory devices configured in a cross point architecture that enables bit-level addressability (e.g., the ability to read from and/or write to individual bits of data, rather than bytes or other larger units of data), and are illustratively embodied as three-dimensional (3D) cross point memory. In some embodiments, the non-volatile memory may additionally include other types of memory, including any combination of memory devices that use chalcogenide phase change material (e.g., chalcogenide glass), ferroelectric transistor random-access memory (Fe-TRAM), nanowire-based non-volatile memory, phase change memory (PCM), memory that incorporates memristor technology, Magnetoresistive random-access memory (MRAM) or Spin Transfer Torque (STT)-MRAM. The volatile memory may be embodied as any type of data storage capable of storing data while power is supplied volatile memory. For example, the volatile memory may be embodied as one or more volatile memory devices, and is periodically referred to hereinafter as volatile memory with the understanding that the volatile memory may be embodied as other types of non-persistent data storage in other embodiments. The volatile memory may have an architecture that enables bit-level addressability, similar to the architecture described above.

The processor 102 and the memory 104 are communicatively coupled to other components of the compute device 100 via the I/O subsystem 112, which may be embodied as circuitry and/or components to facilitate input/output operations with the processor 102 and/or the main memory 104 and other components of the compute device 100. For example, the I/O subsystem 112 may be embodied as, or otherwise include, memory controller hubs, input/output control hubs, integrated sensor hubs, firmware devices, communication links (e.g., point-to-point links, bus links, wires, cables, light guides, printed circuit board traces, etc.), and/or other components and subsystems to facilitate the input/output operations. In some embodiments, the I/O subsystem 112 may form a portion of a system-on-a-chip (SoC) and be incorporated, along with one or more of the processor 102, the main memory 104, and other components of the compute device 100, in a single chip.

The data storage device 114 may be embodied as any type of device configured for short-term or long-term storage of data such as, for example, memory devices and circuits, memory cards, hard disk drives, solid-state drives, or other data storage device. In the illustrative embodiment, the data storage device 114 includes a memory controller 116, similar to the memory controller 106, a media management logic unit 162, similar to the media management logic unit 152, storage media 120, similar to the memory media 110, and media access circuitry 118, similar to the media access circuitry 108, including a tensor logic unit 140, similar to the tensor logic unit 130, scratch pads 142, similar to the scratch pads 132, an ECC logic unit 144, similar to the ECC logic unit 134, compute logic units 146, similar to the compute logic units 136, and a compute media management logic unit 160, similar to the compute media management logic unit 150. The data storage device 114 may include a system partition that stores data and firmware code for the data storage device 114 and one or more operating system partitions that store data files and executables for operating systems.

The communication circuitry 122 may be embodied as any communication circuit, device, or collection thereof, capable of enabling communications over a network between the compute device 100 and another device. The communication circuitry 122 may be configured to use any one or more communication technology (e.g., wired or wireless communications) and associated protocols (e.g., Ethernet, Bluetooth®, Wi-Fi®, WiMAX, etc.) to effect such communication.

The illustrative communication circuitry 122 includes a network interface controller (NIC) 124, which may also be referred to as a host fabric interface (HFI). The NIC 124 may be embodied as one or more add-in-boards, daughter cards, network interface cards, controller chips, chipsets, or other devices that may be used by the compute device 100 to connect with another compute device. In some embodiments, the NIC 124 may be embodied as part of a system-on-a-chip (SoC) that includes one or more processors, or included on a multichip package that also contains one or more processors. In some embodiments, the NIC 124 may include a local processor (not shown) and/or a local memory (not shown) that are both local to the NIC 124. In such embodiments, the local processor of the NIC 124 may be capable of performing one or more of the functions of the processor 102. Additionally or alternatively, in such embodiments, the local memory of the NIC 124 may be integrated into one or more components of the compute device 100 at the board level, socket level, chip level, and/or other levels.

Figure 6:
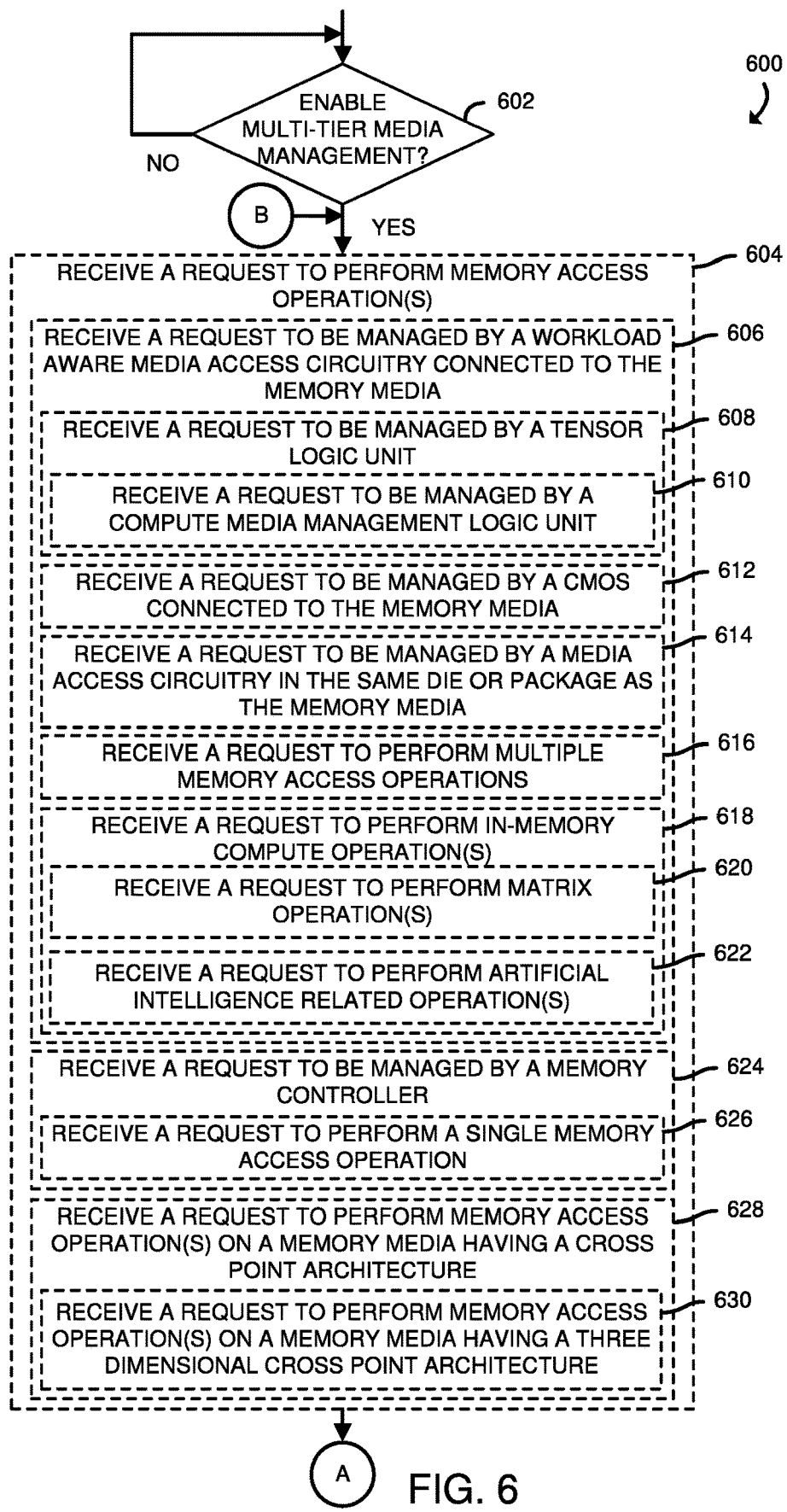
FIGS. 6-8 are simplified diagrams of at least one embodiment of a method for providing multiple tier memory media management may be performed by the compute device of FIG. 1.

Referring now to FIG. 6, the compute device 100, in operation, may execute a method 600 for providing multiple tier memory media (e.g., two different regions 502, 504 of the memory media 110) management. The method 600 is described with reference to the memory 104. However, it should be understood that the method 600 could be additionally or alternatively performed using the memory of the data storage device 114. The method 600 begins with block 602 in which the compute device 100 (e.g., the memory 104) determines whether to enable multiple tier memory media management. The compute device 100 may enable multiple tier memory media management in response to a determination that a configuration setting (e.g., in a configuration file) indicates to enable multiple tier memory media management, in response to a determination that compute media management logic unit 150 and the media management logic unit 152 are present, and/or based on other factors. Regardless, in response to a determination to enable multiple tier memory media management, the method 600 advances to block 604, in which the compute device 100 (e.g., the memory 104) may receive a request to perform one or more memory access operations (e.g., from the processor 102 executing an application). As indicated in block 606, the memory 104 may receive a request to be managed by a workload aware media access circuitry (e.g., the media access circuitry 108) connected to the memory media 110. The media access circuitry 108 is workload aware because it is integral to (e.g., coordinates and utilizes components of the media access circuitry 108 (e.g., the tensor logic unit 130 and more specifically, the compute media management logic unit 150) to perform) in-memory compute operations that may be performed in association with a workload (e.g., the application executed by the processor 102). As indicated in block 608, the request may be a request to be managed by a tensor logic unit (e.g., the tensor logic unit 130 in the media access circuitry 108). Further, and as indicated in block 610, the request may be a request that is to be managed by a compute media management logic unit (e.g., the compute media management logic unit 150). As indicated in block 612, the request may be a request to be managed by a complementary metal-oxide semiconductor (CMOS) connected to the memory media 110 (e.g., to be managed by the media access circuitry 108, which may be formed from a CMOS). The request may be a request to be managed by a media access circuitry located in the same die (e.g., semiconductor die) or package (e.g., semiconductor package) as the memory media 110 (e.g., to be managed by the media access circuitry 108, which may be integrated into the same die or the same package as the memory media 110), as indicated in block 614.

In some embodiments, the request is a request to perform multiple memory access operations (e.g., multiple writes, multiple reads, etc.), as indicated in block 616. As indicated in block 618, the request may be a request to perform one or more in-memory compute operations. For example, and as indicated in block 620, the request may be to perform one or more matrix operations (e.g., a matrix multiplication operation similar to the operation 400 of FIG. 4). As indicated in block 622, the request may be to perform one or more artificial intelligence operations (e.g., operations relating to training a neural network, producing an inference with a neural network, etc.). Alternatively, the request may be a request that is to be managed by the memory controller 106, as indicated in block 624 (e.g., the request does not require an awareness of multiple read and/or write operations performed within the memory 104). For example, and as indicated in block 626, the request may be to perform a single memory access operation (e.g., to write data or to read data). In the illustrative embodiment, and as indicated in block 628, the request is a request to perform one or more memory access operations on a memory media having a cross point architecture (e.g., an architecture in which memory cells sit at the intersection of word lines and bit lines and are individually addressable and in which bit storage is based on a change in bulk resistance). Further, and as indicated in block 630, the request may be a request to perform one or more media access operations on a memory media having a three dimensional cross point architecture (e.g., an architecture in which sets of tiles are stacked as layers, as described with reference to FIG. 2). In other embodiments, the request may be to perform the memory access operations on a memory media having a different architecture.

Figure 7:
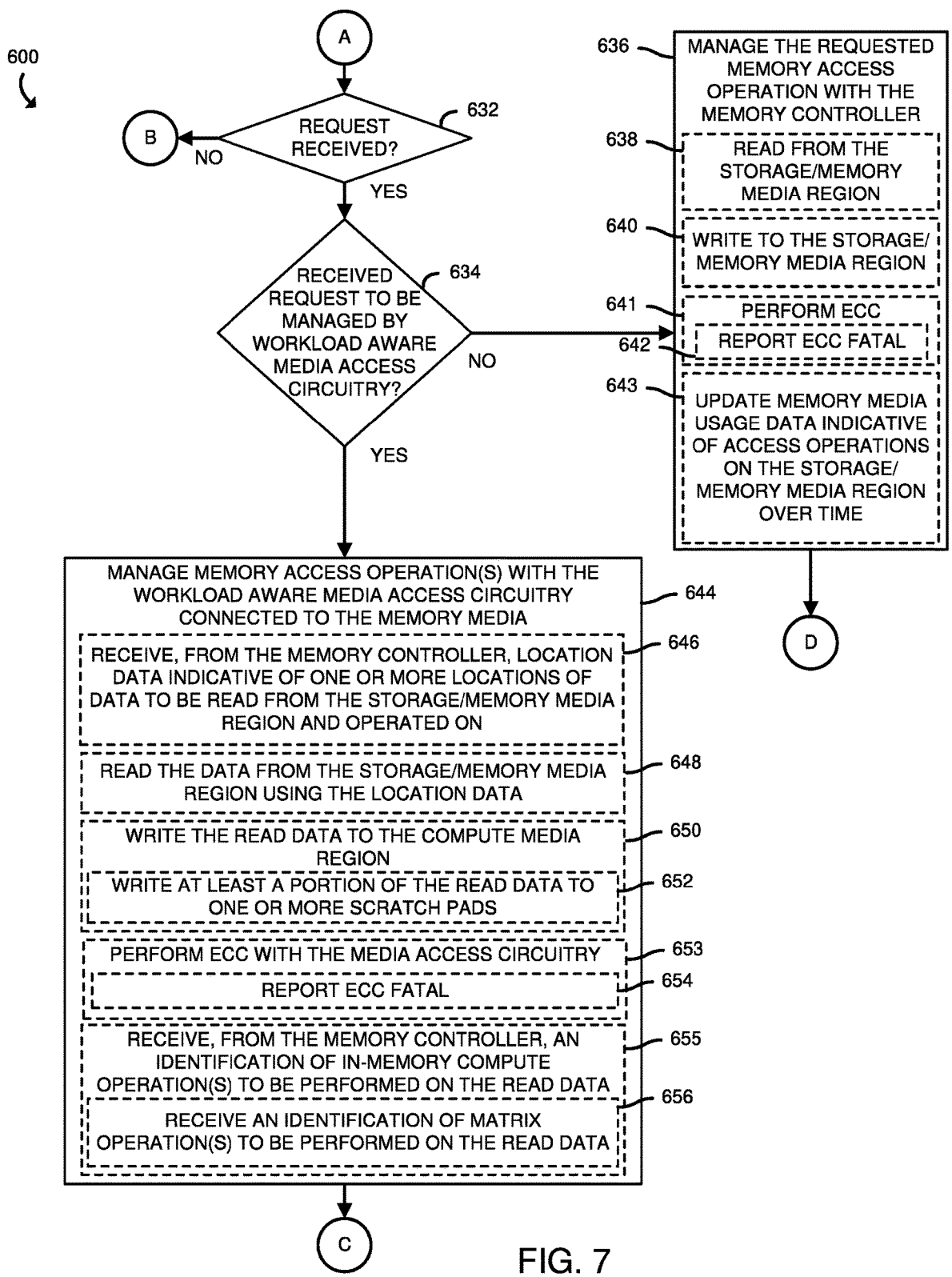

Referring now to FIG. 7, in block 632, the compute device 100 (e.g., the memory 104) determines the subsequent course of action based on whether a request to perform one or more memory operations was received. If not, the method 600 loops back to block 604 of FIG. 6 to potentially receive a request to perform one or more memory access operations. Otherwise (e.g., if a request was received), the method 600 advances to block 634, in which the compute device 100 (e.g., the memory 104) determines the subsequent course of action based on whether the received request is to be managed by a workload aware media access circuitry (e.g., the media access circuitry 108) or not. If the request is not to be managed by the workload aware media access circuitry (e.g., the media access circuitry 108), the method 600 advances to block 636, in which the compute device 100 manages the requested memory access operation with the memory controller 106. In doing so, and as indicated in block 638, the compute device 100 (e.g., the memory controller 106) may read from the storage/memory media region 502 of the memory media 110. Alternatively, the compute device 100 may write to the storage/memory media region 502 of the memory media 110, as indicated in block 640. In performing a read or write operation, the memory controller 106 may perform an error correction code algorithm on the data (e.g., to correct errors in read data or to protect data that is being written). Further, if an error correction code algorithm is unable to correct one or more errors in accessed (e.g., read) data, the memory controller 106 may report the inability to correct the error(s) (e.g., an "ECC fatal" status) to the host (e.g., to the processor 102), as indicated in block 642. As indicated in block 643, the compute device 100 (e.g., the memory controller 106) may update memory media usage data, which may be embodied as any data indicative of access operations that have been performed on the memory media 110 (e.g., the storage/memory media region 502) over time. In doing so, the memory controller 106 may write, to the memory media usage data, a record of the memory access operation that was just performed, including the memory cell(s) that were accessed, a timestamp of when the memory access operation occurred, and the type of access operation that was performed (e.g., read or write).

Referring back to block 634, if the request is instead to be managed by workload aware media access circuitry, the method 600 advances to block 644, in which the compute device 100 (e.g., the media access circuitry 108) manages the requested memory access operation(s). In doing so, and as indicated in block 646, the media access circuitry 108 (e.g., the tensor logic unit 130, and more specifically the compute media management logic unit 150) receives, from the memory controller 106, location data indicative of one or more locations of data to be read from the storage/memory media region 502 and operated on. Further, and as indicated in block 648, the media access circuitry 108 reads the data from the storage/memory media region 502 using the location data (e.g., from block 646). Additionally, in the illustrative embodiment, the media access circuitry 108 may write the read data to the compute media region 504 of the memory media 110, as indicated in block 650. The media access circuitry 108 may also write at least a portion of the read data to one or more of the scratch pads 132 (e.g., to enable relatively quick access to that data), as indicated in block 652. In accessing data, the media access circuitry 108 (e.g., using the ECC logic unit(s) 134) may perform an error correction algorithm to correct one or more errors in read data and/or to protect data that is being written to the memory media 110 (e.g., to the compute media region 504), as indicated in block 653. In some embodiments, if one or more errors in accessed data cannot be corrected, the media access circuitry 108 may report an error to the host (e.g., the processor 102) indicating that the data could not be corrected, as indicated in block 654. As a result, the compute device 100 may end the operation and may report a corresponding error to a user of the compute device 100. In some embodiments, rather than immediately sending an ECC fatal status to the host, the media access circuitry 108 may first send the data to the memory controller 106 to perform a stronger ECC algorithm on the data to potentially correct error(s) that the media access circuitry 108 was unable to correct. As indicated in block 655, the media access circuitry 108, in the illustrative embodiment, receives, from the memory controller 106, an identification of one or more in-memory compute operations to be performed on the data that was read from the storage/memory media region 502 (e.g., a request identifying an in-memory compute operation that was sent from the processor 102 and passed through the memory controller 106 to the media access circuitry 108). For example, and as indicated in block 656, the media access circuitry 108 may receive an identification of one or more matrix operations to be performed on the read data.

Figure 8:
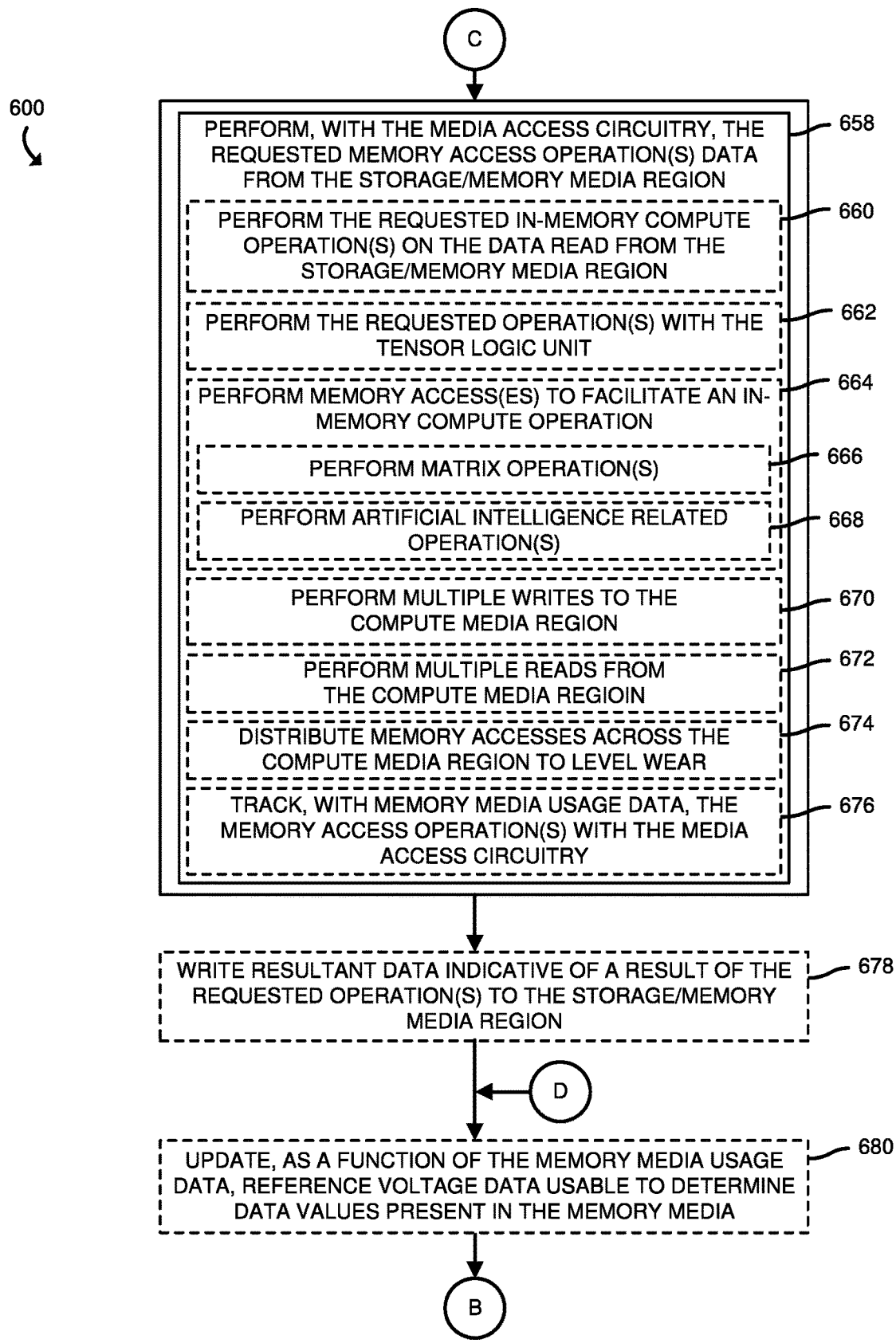

Referring now to FIG. 8, the media access circuitry 108, in the illustrative embodiment, performs the requested memory access operation(s) on data from the storage/memory media region 502, as indicated in block 658. In doing so, and as indicated in block 660, the media access circuitry 108 performs requested in-memory compute operation(s) on the data that was read from the storage/memory media region 502. As indicated in block 662, the media access circuitry 108 performs the operation(s) with the tensor logic unit 130 (e.g., using the compute media management logic unit 150 in the tensor logic unit 130). In performing in-memory compute operation(s), the media access circuitry 108 performs memory accesses to facilitate the in-memory compute operation(s), as indicated in block 664. As indicated in block 666, the media access circuitry 108 (e.g., the tensor logic unit 130 using the compute media management logic unit 150) may perform memory accesses to facilitate one or more matrix operations, such as the matrix multiplication operation 400 of FIG. 4, such as reading matrix elements, multiplying them, and writing a result back to the memory media 110 one or more times. As indicated in block 668, the media access circuitry 108 may perform the memory access operations during the performance of an artificial intelligence related operation (e.g., training a neural network, producing an inference with a neural network, etc.). As indicated in block 670, the media access circuitry 108 may perform multiple writes to the compute media region 504 of the memory media 110. Additionally or alternatively, and as indicated in block 672, the media access circuitry 108 may perform multiple reads from the compute media region 504 of the memory media 110. Further, in performing the memory access operations, the media access circuitry 108 may distribute memory accesses (e.g., writes and reads) across the compute media region 504 of the memory media 110 to level the wear on the memory cells (e.g., to avoid using the same memory cells repeatedly, causing those memory cells to fail faster than other memory cells in the compute media region 504 of the memory media 110), as indicated in block 674. As indicated in block 676, the media access circuitry 108, in the illustrative embodiment, tracks the memory access operation(s) (e.g., updates memory media usage data using a process similar to that described with reference to block 643 of FIG. 7).

Subsequently, in block 678, the media access circuitry 108 writes resultant data indicative of a result of the requested operation(s) (e.g., a matrix multiplication operation) to the storage/memory media region 502, as indicated in block 678. After the media access circuitry 108 has performed block 678 or after the memory controller 106 has performed block 636, the method 600 may proceed to block 680, in which the memory 104 updates, as a function of the memory media usage data, reference voltage data usable to determine data values present in the memory media (e.g., by accounting for the amount of time that has elapsed since a value was written to a given memory cell and the rate at which the voltage drifts from its initial voltage). Subsequently, the method 600 loops back to block 602 of FIG. 6 in which the compute device 100 may receive another request to perform one or more operations.

EXAMPLES

Illustrative examples of the technologies disclosed herein are provided below. An embodiment of the technologies may include any one or more, and any combination of, the examples described below.

Example 1 includes a memory comprising media access circuitry connected to a memory media, wherein the media access circuitry is to receive a request to perform an in-memory compute operation; read, in response to the request, data from a memory media region of the memory media, wherein the memory media region is to be managed by a memory controller; write the read data into a compute media region of the memory, wherein the compute media region is to be managed by the media access circuitry; perform, on the data in the compute media region, the in-memory compute operation; and write, to the memory media region, resultant data indicative of a result of performance of the in-memory compute operation.

Example 2 includes the subject matter of Example 1, and wherein the media access circuitry is further to receive, from the memory controller, location data indicative of a one or more locations of the data to be read from the memory media region of the memory media.

Example 3 includes the subject matter of any of Examples 1 and 2, and wherein the media access circuitry is further to write at least a portion of the read data to one or more scratch pads.

Example 4 includes the subject matter of any of Examples 1-3, and wherein the media access circuitry is further to receive, from a memory controller, an identification of the in-memory compute operation to perform on the read data.

Example 5 includes the subject matter of any of Examples 1-4, and wherein to perform the requested in-memory compute operation comprises to perform a tensor operation.

Example 6 includes the subject matter of any of Examples 1-5, and wherein the media access circuitry is further to perform multiple writes to the compute media region in the performance of the in-memory compute operation.

Example 7 includes the subject matter of any of Examples 1-6, and wherein the media access circuitry is further to perform multiple reads from the compute media region in the performance of the in-memory compute operation.

Example 8 includes the subject matter of any of Examples 1-7, and wherein the media access circuitry is further to distribute memory accesses across the compute media region in the performance of the in-memory compute operation.

Example 9 includes the subject matter of any of Examples 1-8, and wherein the media access circuitry is further to track, with memory media usage data, the memory accesses.

Example 10 includes the subject matter of any of Examples 1-9, and wherein the media access circuitry is further to update, as a function of the memory media usage data, reference voltage data usable to determine data values present in the memory media.

Example 11 includes the subject matter of any of Examples 1-10, and wherein to receive a request to perform an in-memory compute operation comprises to receive a request to perform a matrix operation.

Example 12 includes the subject matter of any of Examples 1-11, and wherein to receive a request to perform an in-memory compute operation comprises to receive a request to perform an artificial intelligence operation.

Example 13 includes the subject matter of any of Examples 1-12, and wherein the media access circuitry is formed from a complementary metal-oxide-semiconductor.

Example 14 includes the subject matter of any of Examples 1-13, and wherein the memory media has a cross point architecture.

Example 15 includes the subject matter of any of Examples 1-14, and wherein the memory media has a three dimensional cross point architecture.

Example 16 includes the subject matter of any of Examples 1-15, and wherein the media access circuitry is further to perform a first error correction algorithm and the memory controller is to perform a second error correction algorithm that is different from the first error correction algorithm.

Example 17 includes a method comprising receiving, by media access circuitry connected to a memory media, a request to perform an in-memory compute operation; reading, by the media access circuitry and in response to the request, data from a memory media region of the memory media, wherein the memory media region is to be managed by a memory controller; writing, by the media access circuitry, the read data into a compute media region of the memory, wherein the compute media region is to be managed by the media access circuitry; performing, by the media access circuitry and on the data in the compute media region, the in-memory compute operation; and writing, by the media access circuitry and to the memory media region, resultant data indicative of a result of performance of the in-memory compute operation.

Example 18 includes the subject matter of Example 17, and further including receiving, by the media access circuitry and from the memory controller, location data indicative of a one or more locations of the data to be read from the memory media region of the memory media.

Example 19 includes the subject matter of any of Examples 17 and 18, and wherein performing the requested in-memory compute operation comprises performing a tensor operation.

Example 20 includes one or more machine-readable storage media comprising a plurality of instructions stored thereon that, in response to being executed, cause media access circuitry connected to a memory media to receive a request to perform an in-memory compute operation; read, in response to the request, data from a memory media region of the memory media, wherein the memory media region is to be managed by a memory controller; write the read data into a compute media region of the memory, wherein the compute media region is to be managed by the media access circuitry; perform, on the data in the compute media region, the in-memory compute operation; and write, to the memory media region, resultant data indicative of a result of performance of the in-memory compute operation.

The invention claimed is:

1. A memory comprising:
   media access circuitry connected to a memory media, wherein the media access circuitry is to:
   receive a request to perform an in-memory compute operation;
   read, in response to the request, data from a memory media region of the memory media, wherein the memory media region is to be managed by a memory controller;
   write the read data into a compute media region of the memory, wherein the compute media region is to be managed by the media access circuitry;
   perform, on the data in the compute media region, the in-memory compute operation;
   write, to the memory media region, resultant data indicative of a result of performance of the in-memory compute operation; and
   perform a first error correction algorithm, wherein the memory controller is to perform a second error correction algorithm that is different from the first error correction algorithm performed by the media access circuitry.

2. The memory of claim 1, wherein the media access circuitry is further to receive, from the memory controller, location data indicative of a one or more locations of the data to be read from the memory media region of the memory media.

3. The memory of claim 1, wherein the media access circuitry is further to write at least a portion of the read data to one or more scratch pads.

4. The memory of claim 1, wherein the media access circuitry is further to receive, from a memory controller, an identification of the in-memory compute operation to perform on the read data.

5. The memory of claim 1, wherein to perform the requested in-memory compute operation comprises to perform a tensor operation.

6. The memory of claim 1, wherein the media access circuitry is further to perform multiple writes to the compute media region in the performance of the in-memory compute operation.

7. The memory of claim 1, wherein the media access circuitry is further to perform multiple reads from the compute media region in the performance of the in-memory compute operation.

8. The memory of claim 1, wherein the media access circuitry is further to distribute memory accesses across the compute media region in the performance of the in-memory compute operation.

9. The memory of claim 8, wherein the media access circuitry is further to track, with memory media usage data, the memory accesses.

10. The memory of claim 9, wherein the media access circuitry is further to update, as a function of the memory media usage data, reference voltage data usable to determine data values present in the memory media.

11. The memory of claim 1, wherein to receive a request to perform an in-memory compute operation comprises to receive a request to perform a matrix operation.

12. The memory of claim 1, wherein to receive a request to perform an in-memory compute operation comprises to receive a request to perform an artificial intelligence operation.

13. The memory of claim 1, wherein the media access circuitry is formed from a complementary metal-oxide-semiconductor.

14. The memory of claim 1, wherein the memory media has a cross point architecture.

15. The memory of claim 14, wherein the memory media has a three dimensional cross point architecture.

16. A method comprising:
   receiving, by media access circuitry connected to a memory media, a request to perform an in-memory compute operation;
   reading, by the media access circuitry and in response to the request, data from a memory media region of the memory media, wherein the memory media region is to be managed by a memory controller;
   writing, by the media access circuitry, the read data into a compute media region of the memory media, wherein the compute media region is to be managed by the media access circuitry;
   performing, by the media access circuitry and on the data in the compute media region, the in-memory compute operation;
   writing, by the media access circuitry and to the memory media region, resultant data indicative of a result of performance of the in-memory compute operation; and performing, by the media access circuitry, a first error correction algorithm, wherein the memory controller is to perform a second error correction algorithm that is different from the first error correction algorithm performed by the media access circuitry.

17. The method of claim 16, further comprising receiving, by the media access circuitry and from the memory controller, location data indicative of a one or more locations of the data to be read from the memory media region of the memory media.

18. The method of claim 16, wherein performing the requested in-memory compute operation comprises performing a tensor operation.

19. One or more non-transitory machine-readable storage media comprising a plurality of instructions stored thereon that, in response to being executed, cause media access circuitry connected to a memory media to:

receive a request to perform an in-memory compute operation;

read, in response to the request, data from a memory media region of the memory media, wherein the memory media region is to be managed by a memory controller;

write the read data into a compute media region of the memory media, wherein the compute media region is to be managed by the media access circuitry;

perform, on the data in the compute media region, the in-memory compute operation; and write, to the memory media region, resultant data indicative of a result of performance of the in-memory compute operation; and perform a first error correction algorithm, wherein the memory controller is to perform a second error correction algorithm that is different from the first error correction algorithm performed by the media access circuitry.

* * * * *